United States Patent
Oku et al.

(10) Patent No.: US 6,445,127 B1
(45) Date of Patent: Sep. 3, 2002

(54) LIGHT-EMITTING DEVICE COMPRISING GALLIUM-NITRIDE-GROUP COMPOUND-SEMICONDUCTOR AND METHOD OF MANUFACTURING THE SAME

(75) Inventors: Yasunari Oku; Hidenori Kamei, both of Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/250,732

(22) Filed: Feb. 16, 1999

(30) Foreign Application Priority Data

| Feb. 17, 1998 | (JP) | ............ | 10-034474 |
| May 8, 1998 | (JP) | ............ | 10-125708 |

(51) Int. Cl.[7] .................... H01J 1/62
(52) U.S. Cl. ............ 313/506; 313/498; 313/509
(58) Field of Search .................. 313/506, 498, 313/509

(56) References Cited

U.S. PATENT DOCUMENTS 5,729,029 A * 3/1998 Rudaz .................. 257/13

FOREIGN PATENT DOCUMENTS

| JP | 06260680 | 9/1994 |
| JP | 08046240 | 2/1996 |
| JP | 09186362 | 7/1997 |
| JP | 10032347 | 2/1998 |
| JP | 11017222 | 1/1999 |

\* cited by examiner

*Primary Examiner*—Frank G. Font
*Assistant Examiner*—Roy M. Punnoose
(74) *Attorney, Agent, or Firm*—McDermott, Will & Emery

(57) ABSTRACT

A gallium-nitride-group compound-semiconductor light-emitting device having an improved luminous intensity that makes it more suitable for use in the full-color outdoor display of an advanced performance. A gallium-nitride-group compound-semiconductor light-emitting device comprising an n-type layer 3, a light-emitting layer 4 and p-type layers 5, 6, the light-emitting layer 4 is doped with a p-type impurity, Mg for example, in a certain specific concentration, so a pn junction is formed within the light-emitting layer 4 and a light emission caused by the electron transition between conduction band and valence band is obtained. In a GaN group compound-semiconductor light-emitting device comprising at least an n-type clad layer 3, a p-type clad layer 5 and a light-emitting layer formed in between the clad layers 3, 5, stacked on a substrate 1. The light-emitting layer 4 is structured as a substance of stacked layers including an n-type layer 41 and a p-type layer 42, or these layers plus an i-type layer formed in between the layers 41 and 42, so a pn junction is formed within the light-emitting layer 4 itself. The injection of electrons and holes into the light-emitting layer 4 is expedited and the luminous intensity of the light-emitting layer 4 is increased.

10 Claims, 2 Drawing Sheets

(PRIOR ART)

LIGHT-EMITTING DEVICE COMPRISING GALLIUM-NITRIDE-GROUP COMPOUND-SEMICONDUCTOR AND METHOD OF MANUFACTURING THE SAME

BACKGROUND OF THE INVENTION

The present invention relates to a light-emitting device comprising a gallium-nitride-group compound-semiconductor, used in optical devices such as a light-emitting diode, a laser diode, etc. More specifically, a semiconductor light-emitting device, in which the efficiency of light emission is maintained high and the color purity is remarkably improved over prior art devices.

Gallium-nitride-group compound-semiconductors have been increasingly used as the semiconductor material for the visible light emitting devices and for electronic devices having high operating temperature. The development has been significant in the field of blue light-emitting diodes.

A basic method of manufacturing the gallium-nitride-group compound-semiconductors is growing a gallium-nitride-group (GaN group) semiconductor film on the surface of an insulating sapphire substrate by means of metal organic CVD. In a practical process of forming a compound-semiconductor layer of GaN group, a substrate is placed in a reaction tube, metal organic compound gases(tri-methyl-gallium, tri-methyl-aluminum, tri-methyl-indium, etc.) are supplied therein as the material gas for the Group III element, and ammonia, hydrazine, etc. are supplied as the material gas for the Group V element, while the substrate is maintained at a high temperature 900° C.–1100° C., so as to have an n-type layer, a light-emitting layer and a p-type layer grown on the substrate in a stacked layer structure.

As described above, a light-emitting device using the GaN group compound semiconductor is useful as a device for emitting a blue light. However, with regard to technical advancement, the blue light-emitting device is slightly behind when compared with devices emitting red or green light. A reason for the delay in technical advancement is to have been caused by the difficulty of finding an appropriate GaN group compound-semiconductor material. Accordingly, blue light-emitting devices need to show an improvement in the luminance and the color purity, which have been inferior relative to those of the red and green devices.

One effort for improving the luminance, for example, is a blue light-emitting diode having a MIS structure; where, a high resistance i-type GaN group compound-semiconductor layer doped with a p-type impurity is provided on an n-type GaN group compound-semiconductor. In a device having the MIS structure, however, both the luminance and the light-emitting output tend to be insufficient for practical applications.

FIG. 4 is a cross sectional side view of a conventional light-emitting device using GaN group compound-semiconductor.

Referring to FIG. 4, a buffer layer 2 is formed on a sapphire substrate 1, and an n-type clad layer 3, a light-emitting layer 4, a p-type clad layer 5 and a p-type contact layer 6 are formed, in order from the bottom, on the buffer layer 2 by a metal organic CVD method. A p-side electrode 7 is formed on the p-type contact layer 6, while an n-side electrode 8 is formed on an exposed surface of the n-type clad layer 3. The exposed portion of the n-type clad layer 3 is the result of etching-off a part of the p-type clad layer 5 and the light-emitting layer 4.

The GaN group compound-semiconductor light-emitting device in general has a structure comprising a pn junction formed by crystallographically connecting the p-type region and the n-type region of a semiconductor. Namely, a p-type layer of semiconductor for the p-type region and an n-type layer of semiconductor for the n-type region are stacked. By applying a voltage of positive polarity on the p-type layer and a voltage of negative polarity on the n-type layer, a hole is injected from the p-type layer into the n-type layer via the pn junction, and an electron is injected from the n-type layer into the p-type layer. As a result of re-combination of the electron and the hole at the vicinity of the pn junction, a light having an energy identical to the band gap energy of semiconductor in the pn junction is emitted.

Japanese Laid-open Patent Publication No.6-260680, for example, proposes a GaN group compound-semiconductor light-emitting device having a light-emitting layer of n-type InGaN layer doped simultaneously with a p-type impurity, Zn, and an n-type impurity, Si. The Publication discloses that the strength of blue light emission increases as a result of an increase in the number of the donor-acceptor pair light emissions. According to the Publication, the efficiency of light emission and the strength of light emission have been significantly improved as compared with the so-called MIS structured light-emitting devices.

Japanese Laid-open Patent Publication No.846240 discloses a light-emitting device in which a p-type light-emitting layer is formed by doping an acceptor impurity, which is a p-type impurity, and a donor impurity, which is an n-type impurity. According to the Publication, the light-emitting layer may have holes at a high concentration and the quantity of electron injection that reaches deep into the light-emitting layer may be increased; which increases the number of electrons making the re-combination with the holes, leading to an increased luminance.

Furthermore, Japanese Laid-open Patent Publication No.9-186362 proposes a light-emitting device, in which the light-emitting layer is doped with a donor impurity and an acceptor impurity together. The light is emitted as the result of the electron transition between donor impurity level and valence band, conduction band and acceptor level, or conduction band and valence band.

The light-emitting devices disclosed in the above Publications are different from each other in terms of the structure, whether the light-emitting layer has p-type conduction or n-type conduction. Apart from the structural differences, the above disclosed light-emitting devices exhibit an improved luminous intensity as compared with the so-called MIS structured light-emitting devices having a junction of metal-insulation layer-n-type semiconductor layer, in place of a pn junction.

In the light-emitting devices for use in an outdoor display, the sun light, among other things, readily causes interference with the emission of light. Therefore, a further increase in the luminous intensity of the light-emitting devices is required for reproducing a clear image that offers a high recognition capability.

Each of the light-emitting devices disclosed in the above Publications make use of the light emission related to the impurities level, such as the D-A (donor-acceptor) pair light emission in which a p-type impurity, being an acceptor impurity, and a donor impurity emit the light in pairs.

The light emission related to the impurity level, however, generally exhibits a light having a broad spectrum. In addition, the peak wavelength of the above light-emitting device tends to shift toward the short wave side along with an increase in operating current. The broad spectrum affects the purity of color reproduction. When the light-emitting devices are used for a full-color display, range of the color reproduction is narrowed. If the peak wavelength shifts towards a shorter wavelength, the color reproduction is degraded.

As described above, the light emission characteristics of a GaN group compound-semiconductor light-emitting device using the light emitting principle related to the impurity level remain unsatisfactory, especially when it is used in a full-color display application because the color purity can be degraded, in addition to the insufficiency in the luminance.

Assuming the light-emitting layer 4 of an exemplary device of FIG. 4 is an n-type layer, a pn junction is formed by the n-type light-emitting layer 4 and the p-type clad layer 5 stacked on the surface of the n-type light-emitting layer 4. Namely, the re-combination of electrons and holes that contribute to the light emission takes place at the vicinity of a junction between the light-emitting layer 4 and the p-type clad layer 5. Therefore, it is difficult to increase the efficiency of light emission of a light-emitting layer 4 which has been formed of a certain specific semiconductor material selected for obtaining a light of predetermined wavelength. This is a point of limitation with regard to increasing the strength of light emission.

In a case of Japanese Laid-open Patent Publication No.8-46240, where the light-emitting layer 4 is a p-type conduction type, a pn junction is formed in relation to the n-type clad layer 3 having contact with the light-emitting layer 4. Therefore, the re-combination of electrons and holes that contribute to the light emission takes place at the vicinity of a junction between the light-emitting layer 4 and the n-type clad layer 3. This is a point of limitation with regard to increasing the strength of light emission.

As described above, when a light-emitting layer of InGaN, or the like material, is formed in either an n-type or a p-type conduction type, a pn junction formed in relation to the p-type clad layer or the n-type clad layer becomes the light emitting region. As a result, the electron and the hole can not be efficiently re-combined within the light-emitting layer alone whose material has been selected to obtain a light of a predetermined wavelength. This is a problem in obtaining a sufficient light-emitting efficiency at a desired wavelength.

The present invention addresses the above described problems, and presents a GaN group compound-semiconductor light-emitting device having an improved luminous intensity that makes it suitable for use in the full-color outdoor display.

SUMMARY OF THE INVENTION

As a result of an extensive study conducted by the inventor on the p-type impurities and the n-type impurities to be doped in a light-emitting layer in an effort to raise the luminous intensity and improve the color purity of emitted light, it was discovered that not only the luminous intensity but also the color purity are remarkably improved by controlling the concentration of the p-type impurity to a certain specific distribution and limiting it within a certain specific concentration range, and forming a pn junction within a light-emitting layer. It was also discovered that if the distribution and the range of the p-type impurity concentration are controlled to a certain specific condition, the influence is negligibly small even if a light-emitting layer is doped with an n-type impurity for a small quantity.

More specifically, the present invention relates to a GaN group compound-semiconductor light-emitting device comprising a p-type layer, a light-emitting layer and an n-type layer of GaN group compound semiconductor stacked in layers by a metal organic CVD method on a substrate, which exhibits an increase in the luminance and the color purity of emitted light by doping the light-emitting layer with a p-type impurity in a mode where the concentration of p-type impurity at a side having contact with the p-type layer gradually decreases towards the other side having contact with the n-type layer.

In accordance with the above described light-emitting device, and the manufacturing method therefor, the pn junction is formed within the light-emitting layer and exhibits an increased efficiency in the light emission. The p-type impurity is not doped to such a high concentration level at which a light emission between the conduction band and the acceptor level becomes dominating; therefore, the light-emitting device uses a light emission due to the electron transition between conduction band and valence band, instead of using the light emission related to the acceptor level.

In a case of a laser diode, a wave guide layer is generally formed between the light-emitting layer and the n-type and p-type clad layers for confining and guiding a light generated from the light-emitting layer within around the vicinity, and help confining the carrier within the light-emitting layer. The layer for guiding the light has a function that is identical to the clad layer, in that it confines the carrier within the light-emitting layer. Accordingly, the present invention includes among the requirements either of the following structures; leaving each of the p-type and n-type clad layers as a single layer or forming a light guiding layer as described above.

Accordingly, it is an object of the present invention to provide a GaN group compound-semiconductor light-emitting device which comprises an n-type layer, a light-emitting layer and a p-type layer of GaN group compound semiconductor stacked on a substrate. The light-emitting layer is doped with a p-type impurity in a mode where the concentration at a side having contact with the p-type layer gradually decreases towards the side having contact with the n-type layer. As a pn junction is formed within the light-emitting layer, electrons and holes are injected into the light-emitting layer at a more efficient manner. The luminous intensity is also increased.

In a variation of the foregoing, the device of the present invention comprises a GaN group compound-semiconductor light-emitting device, wherein the concentration of the p-type impurity doped into the light-emitting layer is within a range, not lower than $1 \times 10^{16}$ cm$^{-3}$ and not higher than $5 \times 10^{18}$ cm$^{-3}$, at the side having contact with the n-type layer. This makes it easier to form a pn junction within the light-emitting layer, which leads to a higher luminous intensity and color purity.

In another variation, the device of the present invention comprises a GaN group compound-semiconductor light-emitting device, wherein the concentration of the p-type impurity doped into the light-emitting layer is within a range, not lower than $1 \times 10^{18}$ cm$^{-3}$ and not higher than $5 \times 10^{20}$ cm$^{-3}$, at the side having contact with the p-type layer. This makes it easier to form a pn junction within the light-emitting layer, which leads to a higher luminous intensity and color purity.

In accordance with the foregoing variations of the present invention, besides the advantage of easier forming of a pn junction within the light-emitting layer, the side of light-emitting layer having contact with n-type layer can be maintained as an n-type region even after the p-type impurity is doped at a certain lowered concentration in the region. Furthermore, by raising the concentration of p-type impurity at the side having contact with the p-type layer up-to a certain specific range, the side is maintained as a p-type region. Thus, a pn junction is surely formed within the light-emitting layer. If concentration of the p-type impurity is controlled to fall within the above described range, the light emission due to the electron transition between conduction band and acceptor level is very small. Therefore, a light emission caused by the transition between conduction band and valence band may be used.

In another variation of the device of the present invention, the light-emitting layer is comprised of In x Ga $_1$-x N ($0<x<1$). As the light-emitting layer contains no Al, the deterioration of crystalline property of light-emitting layer may be suppressed.

In another variation of the device of the present invention, the p-type impurity is Mg. As it is difficult for the Mg to form a deep impurity level in a GaN group compound-semiconductor, as compared to Zn and other p-type impurities, a light-emitting layer is obtained in which the light emission related to the acceptor level is difficult to occur.

The present invention also relates to a method for manufacturing a GaN group compound-semiconductor light-emitting device comprising the steps of forming, an n-type layer, a light-emitting layer and a p-type layer of GaN group compound-semiconductor on a substrate by a metal organic CVD method. The light-emitting layer is doped with a p-type impurity in a mode where the concentration at a side having contact with the p-type layer gradually decreases toward the side having contact with the n-type layer. A pn junction is formed within the light-emitting layer.

In a variation of the method of the present invention, the doping of p-type impurity is performed by diffusion of a p-type impurity contained in the p-type layer from the p-type layer containing the p-type impurity. With the present manufacturing method, a light-emitting layer having a graded concentration is formed, where the concentration of the impurity decreases from the side having contact with p-type layer towards the n-type layer.

In another variation of the method of the present invention, the p-type impurity is Mg. As it is difficult for the Mg to form a deep impurity level in a GaN group compound-semiconductor, as compared to Zn and other p-type impurities, a light-emitting layer may be obtained in which the light emission related to the acceptor level is difficult to occur.

In another variation, the device of the present invention comprises a GaN group compound-semiconductor light-emitting device comprising an n-type clad layer, a light-emitting layer and a p-type clad layer of GaN group compound-semiconductor formed on a substrate, wherein the light-emitting layer is formed as a substance of stacked layers, namely, an n-type layer provided in the side of the n-type clad layer and a p-type layer provided in the side of the p-type clad layer. As a pn junction is formed within the light-emitting layer, the injection of electrons and holes into the light-emitting layer is expedited, and the electrons and holes are re-combined in the light-emitting layer in a more efficient manner.

In another variation of the device of the present invention, the device comprises a GaN group compound-semiconductor light-emitting device comprising an n-type clad layer, a light-emitting layer and a p-type clad layer of GaN group compound-semiconductor formed on a substrate, wherein the light-emitting layer is formed as a substance of stacked layers, namely, an n-type layer provided in the side of the n-type clad layer, a p-type layer provided in the side of the p-type clad layer and an i-type layer formed between the n-type layer and the p-type layer. As a pn junction is formed within the light-emitting layer, the injection of electrons and holes into the light-emitting layer is expedited, and the electrons and holes are recombined in the light-emitting layer in a more efficient manner.

The invention itself, together with further objects and advantages, can be better understood by reference to the following detailed description and the accompanying drawings.

DETAILED DESCRIPTION OF THE INVENTION

First Exemplary Embodiment

Figure 1:
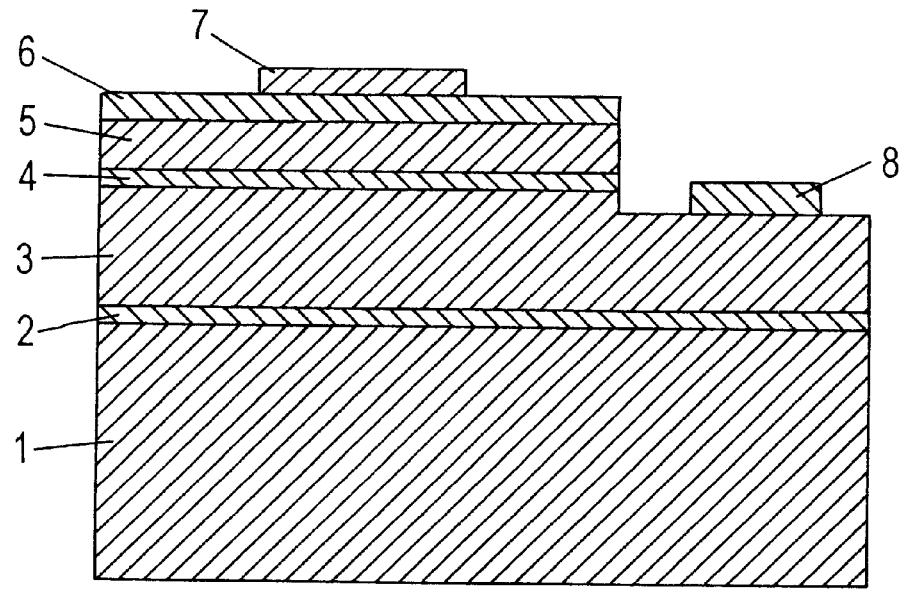
FIG. 1 is a vertical cross sectional view showing the structure of a GaN group compound-semiconductor light-emitting device in accordance with a first exemplary embodiment of the present invention.

A practical example in accordance with a first embodiment of the present invention is described below referring to the drawings.

FIG. 1 is a cross sectional view showing the structure of a GaN group compound-semiconductor, light-emitting device in accordance with a first embodiment of the present invention.

In FIG. 1, a buffer layer 2 is formed on a sapphire substrate 1. On the buffer layer 2, an n-type layer 3, a light-emitting layer 4, a p-type clad layer 5 and a p-type contact layer 6 are formed, in order from the bottom, by a metal organic CVD method. A p-side electrode 7 is formed on the p-type contact layer 6, and an n-side electrode 8 is formed on the surface of the n-type layer 3, which is exposed as a result of etching-off part of the p-type clad layer 5 and the light-emitting layer 4. The n-side electrode 7 may be formed of aluminum(Al), titanium(Ti) and other metals. Each of the p-side and n-side electrodes may be formed by means of metal deposition.

For the buffer layer 2, GaN, GaAlN, AlN, AlInN and the like may be used. The light-emitting layer 4 is formed of InGaN, and is doped with Mg, as the p-type impurity, to a certain predetermined concentration range.

For the p-type clad layer 5, AlGaN, GaN, AlGaInN and the like may be used. For the p-type contact layer 6, GaN, InGaN and the like may be used. Mg is used as the p-type impurity for doping the p-type clad layer 5 and the p-type contact layer 6.

In the present invention, the light-emitting layer 4 is doped with the impurity Mg. The Mg doping is performed through diffusion from the p-type layer.

Because it is difficult for Mg, as compared with Zn and other p-type impurities, to form an impurity level deep in the GaN group compound-semiconductor, a deep p-type impurity level may not be formed in a light-emitting device. Therefore, a light-emitting layer 4 is obtained in which a light emission that is related to the acceptor level is difficult to occur. As the Mg doping is conducted by means of diffusion from the p-type layer, it is easier to prevent the light-emitting layer 4 from being doped for the entire part at a high concentration level, as compared with a case where the light-emitting layer 4 is doped direct with Mg. As such, a state of graded concentration, where the Mg concentration is gradually decreasing from a side having contact with p-type layer towards the side having contact with n-type layer 3, is easily provided.

Generally speaking, the light-emitting layer 4 of GaN group compound-semiconductor tends to exhibit the n-type conduction while it is un-doped. By providing a light-emitting layer 4 with the above described distribution of the p-type impurity concentration, a p-type conduction is provided at the p-type layer side, where the concentration is high, while an n-type conduction is provided at the n-type layer side, where the concentration is low. Thus, a pn junction is formed within the light-emitting layer 4.

The light-emitting layer 4 is made of InGaN, which does not contain Al. If Al is included, the crystalline property tends to degrade, which leads to a degradation of light-emitting layer 4.

By forming a light-emitting layer 4 with InGaN, with the exclusion of Al, the crystalline property is preserved high and there will be no deterioration in the light-emitting characteristics.

As a result of extensive research activities conducted by the inventors attempting to raise and maintain the luminance and improve the color purity of a light-emitting device comprising a GaN group compound-semiconductor, it was found out through the actual observation that remarkable improvements are achieved by using a light emission caused by the electron transition between conduction band and valence band, instead of using the light emission which is related to the impurity level employed in the conventional technologies described above.

More specifically, a light emission caused by the electron transition between conduction band and valence band is obtained, without using the light emission related to the acceptor level formed by a p-type impurity, if the light-emitting layer 4 is doped with a p-type impurity in a concentration level at which the acceptor level is not formed. The research also revealed that the improvements are made in both the luminous efficiency and the color purity when the concentration of Mg, or a p-type impurity, is controlled to be within a range, not lower than $1\times10^{16}$ cm$^{-3}$ and not higher than $5\times10^{20}$ cm$^{-3}$.

The fact that the light emission related to the impurity level, such as the D-A pair light emission, is not used in the area where the Mg concentration is not higher than $1\times10^{16}$ cm$^{-3}$ is clear from the fact that the wavelength of the light emitted at the above Mg concentration area is identical to that of un-doped state, where a light due to the electron transition between conduction band and valence band is exhibited. If the Mg concentration of a light-emitting layer is not lower than $5\times10^{20}$ cm$^{-3}$, a light emission related to the acceptor level is dominant.

As described above, a light emission caused by the electron transition between conduction band and valence band is obtained by doping the Mg so that the concentration falls within a certain specified range. The light thus emitted has a spectrum that is sharper as compared with that of a light emitted in relation to the impurity level. The peak wavelength of the former light hardly shifts to the short wavelength side even when the operating current is increased. The color purity is improved.

When a light-emitting layer 4 is doped to have a graded concentration mode, where the Mg concentration is decreasing from a side having contact with the p-type layer towards the side having contact with n-type layer 3, a pn junction is formed within the light-emitting layer 4. With the pn junction formed within the light-emitting layer 4 itself, a light-emitting device of high luminous efficiency is presented. The formation of the pn junction in the n-type layer 3 is prevented, by lowering the concentration of Mg, or p-type impurity, at the side having contact with the n-type layer 3. If the Mg concentration at the side having contact with p-type layer is high, the efficiency of current injection into light-emitting layer 4 may be made high, which leads to a still higher luminous efficiency.

By controlling the concentration of Mg, a p-type impurity, to be doped into a light-emitting layer 4 to be within the above described range, (i.e., not lower than $1\times10^{16}$ cm$^{-3}$ and not higher than $5\times10^{20}$ cm$^{-3}$), both of the luminous efficiency and the color purity are improved.

Even within the specified concentration range, it was also confirmed that if the Mg concentration at the side having contact with the n-type layer 3 is above $1\times10^{18}$ cm$^{-3}$ the light-emitting layer 4 tends to exhibit the p-type in its whole structure, and the luminous intensity goes down. If the Mg concentration is lower than $1\times10^{16}$ cm$^{-3}$, the pn junction could be formed inclined towards the p-type layer, or the light-emitting layer 4 as a whole could exhibit the n-type, rendering it to have a high resistance. This also degrades the luminous intensity.

If the Mg concentration at the side having contact with the p-type layer is above $5\times10^{20}$ cm$^{-3}$, a light emission related to the acceptor level is observed and the color purity tends to be degraded. If the Mg concentration at the side having contact with the p-type layer is lower than $1\times10^{18}$ cm$^{-3}$, it turns out to be difficult to make the region into the p-type, and therefor a pn junction cannot be formed within the light-emitting layer 4. The luminous intensity tends to degrade.

In order to obtain an improvement in both aspects, the luminous intensity and the color purity, the light-emitting layer of the present invention should preferably be doped with no n-type impurity. However, if the concentration of a p-type impurity, Mg, to be doped into the p-type layer is controlled to meet the above described conditions, the influence of an n-type impurity, if doped for a small quantity, remains to be negligibly small. So, the formation of pn junction within the light-emitting layer is possible. This is confirmed by the fact that even when Si, for example, is doped as an n-type impurity for approximately $1\times10^{17}$ cm$^{-3}$, the side of light-emitting layer having contact with p-type layer maintains the p-type conduction while the side having contact with n-type layer maintains the n-type conduction as well. The p-type and the n-type conductions are thus maintained, which makes it possible to form a pn junction within a light-emitting layer. No light emission that is related to the acceptor level is observed. Namely, even if an n-type impurity is doped, the improvements in both aspects, the luminous intensity and the color purity, may be expected so long as the doping stays at a level where the p-type conduction is preserved at the side of light-emitting layer having contact with p-type layer.

Embodiment 1

A method for manufacturing the foregoing embodiment of the semiconductor light-emitting device of the present invention is described in the following.

The present embodiment refers to a method of growing a GaN group compound-semiconductor by a metal organic CVD method. Reference is made to FIG. 1.

First, a sapphire substrate 1 having a mirror-polished surface is set on a substrate holder within a reaction tube. The substrate 1 is maintained at 1100° C. on the surface for 10 minutes, and is cleaned to remove any organic substance and other stains sticking on the surface by heating the substrate in hydrogen gas flow.

Then, the surface temperature of the substrate 1 is lowered down to 600° C., and a buffer layer 2 of AlN is grown to a thickness of 25 nm by providing nitrogen gas, as the main carrier gas, at 10 liter/min., ammonia at 5 liter/min. and a TMA carrier gas containing tri-methyl-aluminum(TMA) at 20 cc/min.

The supply of the TMA carrier gas is discontinued and the temperature is raised up-to 1050° C. Then, while continuing the flow of nitrogen gas at 9 liter/min., and hydrogen gas at 0.95 liter/min., new gases are provided, namely, a carrier gas of tri-methyl-gallium(TMG) at 4 cc/min., a 10 ppm $SiH_4$ (mono-silane) gas, as the source of Si, at 10 cc/min. for a duration of 60 min. in order to grow an n-type layer 3 of Si doped GaN to a thickness of approximately 2 µm.

After the n-type latter 3 is grown and formed, the supply of TMG carrier gas and the $SiH_4$ gas is discontinued, the surface temperature of the substrate is lowered down to 750° C., and then, nitrogen gas, as the main carrier gas, is newly provided at 10 liter/min., a carrier gas of TMG at 2 cc/min., and a carrier gas of tri-methyl-indium(TMI) at 200 cc/min. for a duration of 100 sec. in order to grow a light-emitting layer 4 of InGaN to a thickness of 10 nm.

After the light-emitting layer 4 is formed, the TMI carrier gas and the TMG carrier gas are discontinued, the surface temperature of the substrate 1 is raised up-to 1050° C., and nitrogen gas, as the main carrier gas, is newly provided at 9 liter/min., hydrogen gas at 0.90 liter/min., a TMG carrier gas at 4 cc/min., a TMA carrier gas at 6 cc/min., a carrier gas of bis-cyclo-pentadienyel-magnesium($Cp_2Mg$), or the Mg source, at 60 cc/min. for a duration of 4 min. in order to grow a p-type clad layer 5 of Mg doped AlGaN to a thickness of 0.1 µm.

After the p-type clad layer 5 is grown and formed, the TMA carrier gas, the TMG carrier gas and the $Cp_2Mg$ carrier gas are discontinued. The substrate temperature is maintained at 1050° C. for a duration of 10 min. to diffuse the Mg doped in the p-type clad layer 5 into the light-emitting layer 4.

Maintaining the temperature 1050° C., nitrogen gas, as the main carrier gas, is newly provided at 9 liter/min., hydrogen gas at 0.90 liter/min., a TMG carrier gas at 4 cc/min. and a $Cp_2Mg$ carrier gas at 100 cc/min. for a duration of 3 min. in order to grow a p-type contact layer of Mg doped GaN in the thickness of 0.1 µm.

After the growth is completed, the supply of material gases, a TMG carrier gas, a $Cp_2Mg$ carrier gas, and ammonia is discontinued. The flow of nitrogen gas and hydrogen gas is maintained at the same flow rate until the wafer is cooled down to the room temperature. The wafer is then taken out of the reaction tube.

On the surface of a substance of stacked layers of GaN group compound-semiconductor containing a pn junction structured through the above described procedure, a $SiO_2$ film is deposited by a CVD method. An etching mask is provided by patterning the film through a photo lithographic process. The p-type contact layer 6, the p-type clad layer 5 and the light-emitting layer 4 are partially etched-off by a reactive ion etching method in the depth of approximately 0.25 µm to expose the surface of n-type layer 3. On the exposed surface of n-type layer 3, an n-side electrode 8 of Al is formed using photo-lithography and deposition. In the same way, a p-side electrode 7 of Ni and Au is formed on the surface of p-type contact layer 6.

The sapphire substrate 1 is polished in the reverse surface down to approximately 100 µm thick, and separated into chips by scribing. A light-emitting device thus manufactured comprises a pn junction formed within the light-emitting layer 4. In the light-emitting layer 4 of the light-emitting device, the Mg concentration has a graded distribution; which equals $1 \times 10^{19}$ cm$^{-3}$, at a side having contact with p-type clad layer 5 and which gradually decreases down to $2 \times 10^{17}$ cm$^{-3}$ at the side having contact with n-type layer 3.

A separated chip is attached on a stem with the surface having the electrode up. The respective n-side electrode 8 and p-side electrode 7 on the chip are connected with wire to electrodes of the stem, and the whole structure is resin-molded to complete a light-emitting diode. When the light-emitting diode is driven with 20 mA forward current, it emits a blue light of 450 nm wavelength; has a spectral half band width of 18 nm, and a luminous output 1100 µW.

As a comparative example, a light-emitting device has been manufactured in the same procedure as in the above embodiment, except that; in the process for growing light-emitting layer 4 and p-type clad layer 5, a light-emitting layer 4 of n-type InGaN doped with Si and Zn has been grown to a thickness of 10 nm by newly providing, at 750° C., nitrogen gas, or the main carrier gas, at 10 liter/min., a TMG carrier gas at 2 cc/min., a carrier gas of tri-methyl-indium at 100 cc/min., $SiH_4$ gas at 10 cc/min., diethyl-zinc gas as the Zn source at 10 cc/min. for a duration of 100 sec. And then, the supply of TMI carrier gas, TMG carrier gas, $SiH_4$ gas and diethyl-zinc gas is discontinued and the surface temperature of the substrate is raised up-to 1050° C. to grow a p-type clad layer 5. When the light-emitting diode is driven with 20 mA forward current, it emitted blue light of 450 nm wavelength. However, the spectral half band width of the diode is 50 nm, which is greater than that of the earlier embodiment. In addition, the color purity is also degraded, and the output of light emission is 710 µW.

In the present embodiment, the diffusing operation of a p-type impurity contained in the p-type layer into a light-emitting layer 4 from the p-type layer containing the p-type impurity has been conducted by; first growing a p-type clad layer 5, and then the substrate is kept at a certain temperature to diffuse Mg contained in the p-type clad layer 5 into the light-emitting layer 4. There may be other alternative procedures for diffusing Mg into light-emitting layer 4; growing a p-type contact layer 6 and then keeping the substrate at a certain temperature for diffusing Mg contained in p-type clad layer 5, growing a p-type layer and then raising the substrate temperature high for diffusing within a relatively short time, growing a p-type layer and then lowering the substrate temperature down for allowing the diffusion process to take a relatively long time, and other such methods. The diffusing operation of p-type impurity into light-emitting layer 4 is conducted depending on such factors as the concentration of a p-type impurity contained in p-type layer, the time and temperature provided for the diffusion, and the like factors. Therefore, these factors should be adjusted and optimized so that the concentration of p-type impurity doped in the light-emitting layer 4 falls within the desired range as described above.

Second Exemplary Embodiment

Figure 2:
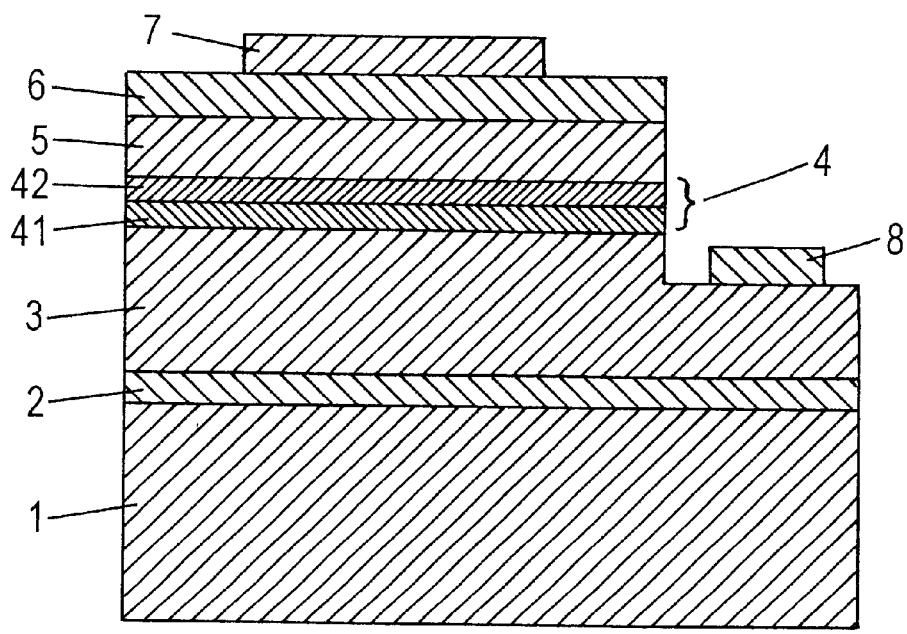
FIG. 2 is a vertical cross sectional view showing the structure of a GaN group compound-semiconductor light-emitting device in accordance with second exemplary embodiment of the present invention.
Figure 4:
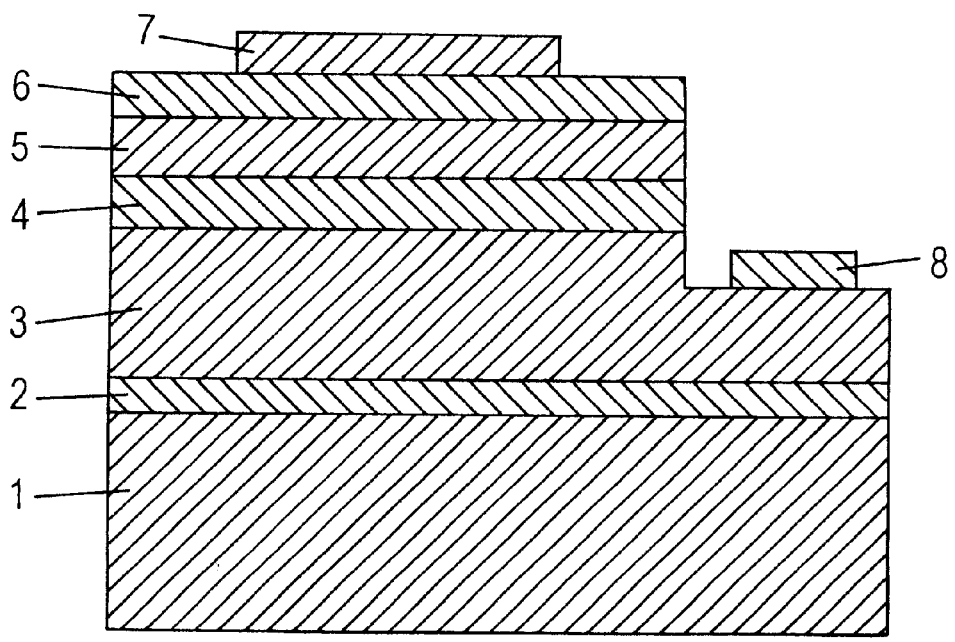
FIG. 4 is a vertical cross sectional view of a conventional GaN group compound-semiconductor light-emitting device.

FIG. 2 is a vertical sectional view showing the structure of a GaN group compound-semiconductor light-emitting device in accordance with another embodiment of the present invention. The layers of GaN compound-semiconductor film formed on the sapphire substrate remain the same as those of the prior art technology shown in FIG. 4, with the exception of a light-emitting layer. Those parts identical to those of the prior art are represented by providing the same marks, and detailed explanation of which is omitted here.

In FIG. 2, a buffer layer 2, an n-type clad layer 3, a light-emitting layer 4, a p-type clad layer 5 and a p-type contact layer 6 are stacked in layers on a sapphire substrate 1. A p-side electrode 7 is formed on the p-type contact layer 6, while an n-side electrode 8 is formed on the surface of the n-type layer 3 exposed by partially etching-off the p-type clad layer 5 and the light-emitting layer 4. The n-side electrode 8 can be formed of aluminum(Al), titanium(Ti) or such other metals. Each of the p-side and n-side electrodes 7, 8 is formed by metal deposition. The light-emitting layer 4 is preferably formed with a GaN group compound-semiconductor such as InGaN, InGaAlN, whose band-gap energy is smaller than that of the n-type clad layer 3 and the p-type clad layer 5. More specifically, an InGaN whose indium composition is optimized for providing a band-gap energy suitable to generate a light of desired wavelength is preferred.

In the present embodiment, the light-emitting layer 4 has been formed as a double-layered structure consisting of an n-type layer 41 having contact with the n-type clad layer 3 and a p-type layer 42 stacked on the n-type layer 41 and having contact at the upper surface with the p-type clad layer 5.

The n-type layer 41 has been formed to exhibit an n-type conduction, by either doping an n-type impurity such as Si, Ge during the earlier described CVD process of InGaN, InGaAlN and other GaN group compound-semiconductors, or not doping any n-type impurity, leaving it as an "undoped". The GaN group compound-semiconductor can be made to exhibit an n-type conduction without doping Si, Ge or any other n-type impurity. Doping of an n-type impurity may enhance the efficiency of electron injection into a light-emitting layer 4.

The p-type layer 42 has been formed to exhibit a p-type conduction by doping Mg during the CVD process of InGaN, InGaAlN and other GaN group compound-semiconductors. Besides the Mg, the impurities of Zn, Cd, Be, Ca, C, etc. may also be used as the p-type dcopant. When Mg is used as the dopant, for which material the deep level formation within the light-emitting layer 4 is difficult, a light emission using the band-to-band transition in the light-emitting layer 4 is readily available, and the efficiency of light emission goes higher. Therefore, it is preferred to use Mg as the dopant in view of improving the luminance.

What is required for the n-type clad layer 3, which is locating under the light-emitting layer 4 and having the n-type layer 41 stacked thereon, is that it is a GaN group compound-semiconductor whose band gap energy is greater than that of light-emitting layer 4. GaN, InGaN, InGaAlN etc., for example, can be utilized.

What is required for the p-type clad layer 5, which is locating on the light-emitting layer 4 and stacked on the surface of the p-type layer 42, is that it is a GaN group compound-semiconductor whose band gap energy is greater than that of light-emitting layer. GaN, InGaN, AlGaN, InGaAlN, etc., for example, can be utilized.

By forming a light-emitting layer 4 in a double-layered structure of n-type layer 41 and p-type layer 42, a pn junction is formed within the light-emitting layer 4 by the n-type layer 41 and the p-type layer 42. Therefore, the injection of electrons and holes into a light-emitting layer 4 is expedited, and the re-combination of electrons and holes is readily performed within the light-emitting layer 4. Thus the luminous efficiency is improved and the luminous intensity is raised.

Furthermore, the double layered light-emitting layer 4 comprising the p-type layer 42 and the n-type layer 41 has contact at the n-type layer 41 with n-type clad layer 3, while at the p-typo layer 42 with p-type clad layer 5. In the above described layered structure, a pn junction is formed without fail inside of the light-emitting layer 4, electrons are injected efficiently into the light-emitting layer from the n-type clad layer 3, and holes are injected efficiently into the light-emitting layer 4 from the p-type clad layer 5. The re-combination of electrons and holes within the light-emitting layer 4 readily occurs, and the luminous efficiency is improved a step higher.

Figure 3:
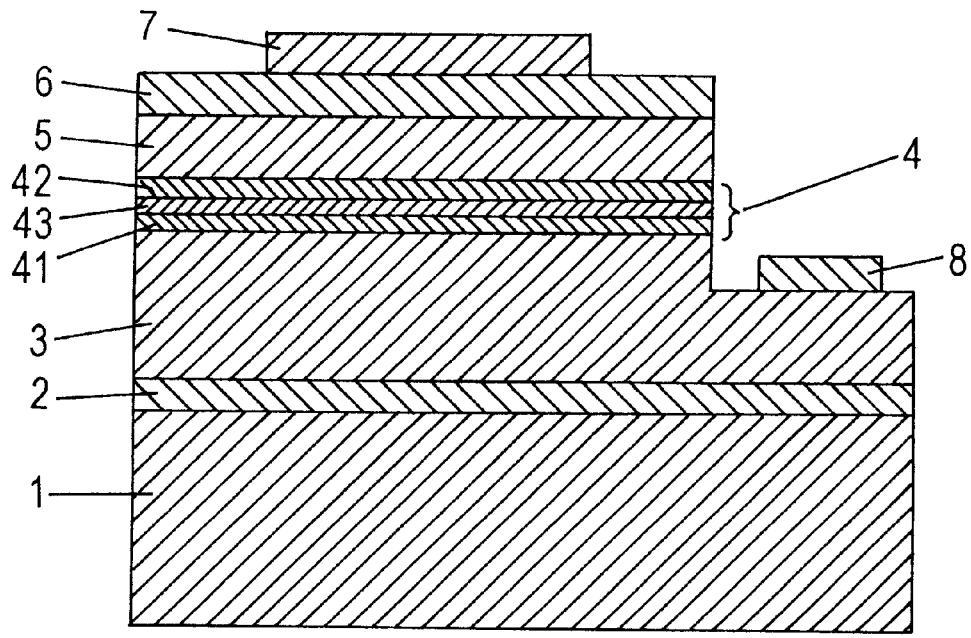
FIG. 3 is a vertical cross sectional view of a GaN group compound-semiconductor light-emitting device, showing the structure of a light-emitting layer comprised of three layers, n-type layer, i-type layer and p-type layer.

FIG. 3 is a vertical sectional view of a GaN group compound-semiconductor light-emitting device in accordance with a third exemplary embodiment of the present invention. Those parts identical to those of FIG. 2 are represented by providing the same reference numerals, and detailed explanation of which is omitted here.

In addition to the n-type layer 41 and the p-type layer 42, the light-emitting layer 4 of the present embodiment further comprises an i-type layer 43 in between the layers 41 and 42, forming a three-layered structure. This is the only difference from the structure shown In FIG. 2.

In the present embodiment, the i-type layer 43 refers to either a p-type layer having a high resistivity and a very low carrier concentration, or an n-type layer. The i-type layer 43 can be provided as a layer of very low carrier concentration by doping an n-type impurity such as Si, Ge, and a p-type impurity such as Mg at a same time, or causing a carrier compensation through the doping of a small quantity of p-type impurity, such as Mg, without doping any n-type impurity. The simultaneous doping of n-type impurity and p-type impurity can be accomplished by supplying the material gases of n-type impurity and p-type impurity together during the crystalline growth of light-emitting layer 4. Alternatively, after forming an n-type layer 41 by doping an n-type impurity, or leaving it as an "undoped", without doping any n-type impurity, a region which is doped with n-type and p-type impurities or with p-type impurity alone at a low concentration is formed, during formation of the p-type layer 42 doped with p-type impurity and the p-type clad layer 5, by diffusing the p-type impurities contained in these p-type layers into part of the n-type layer. The region is provided in a layered form, making it as the i-type layer.

With the light-emitting layer 4 of a three-layered structure comprising the n-type layer 41, the i-type layer 43 and the p-type layer 42, a pn junction is formed within of the light-emitting layer 4, because the n-type layer 41 and the p-type layer 42 are disposed with the i-type layer 43 of very low carrier concentration in between them. The re-combination of electrons and holes is therefore expedited within the light-emitting layer 4, and the luminous intensity is increased.

Although, in the specimen of FIG. 2 and FIG. 3, the n-type clad layer 3, the light-emitting layer 4 and the p-type clad layer 5 are stacked, in order from the bottom, on the substrate 1 via the buffer layer 2, it can also be structured such that the n-type clad layer 3 and the p-type clad layer 5 are exchanged with each other. Namely, the p-type clad layer 5, the light-emitting layer 4 and the n-type clad layer 3 may be stacked in order from the substrate 1, the light-emitting layer 4 being provided with a p-type layer 42 at the side of p-type clad layer 5 and an n-type layer 41 at the side of n-type layer 3, respectively. Also, the specimen device containing the i-type layer 43 as shown in FIG. 3 can be structured in a similar manner.

Embodiment 2

Referring again to FIG. 2, an exemplary process for forming the device is now described. First, a sapphire substrate 1 having a mirror-polished surface is set on a substrate holder within a reaction tube. The substrate 1 is maintained at 1100° C. on the surface for 10 minutes, and cleaned to remove organic substance and other stains sticking on the surface by heating the substrate in a hydrogen gas flow.

Then, the surface temperature of substrate 1 is lowered to 600° C., and a buffer layer 2 of AlN is grown to a thickness of 25 nm by providing nitrogen gas, as the main carrier gas, at 10 liter/min., ammonia at 5 liter/min. and a TMA carrier gas containing tri-methyl-aluminum(TMA) at 20 cc/min.

The supply of the TMA carrier gas is discontinued and the temperature is raised up-to 1050° C. Then, while continuing the flow of nitrogen gas at 9 liter/min., and hydrogen gas at 0.95 liter/min., new gases are added, namely, a carrier gas of tri-methyl-gallium(TMG) at 4 cc/min., a 10 ppm $SiH_4$ (mono-silane) gas, as the source of Si, at 10 cc/min. for a duration of 60 min. in order to grow an n-type layer 3 of Si doped GaN to a thickness of 2 $\mu$m.

After the n-type clad layer 3 is grown and formed, the supply of TMG carrier gas and the $SiH_4$ gas is discontinued, the surface temperature of substrate 1 is lowered down to 750° C., and new gases are provided; nitrogen gas, as the main carrier gas, at 10 liter/min., a TMG carrier gas at 2 cc/min., and a TMI(tri-methyl-indium) carrier gas at 200 cc/min. for a duration of 60 sec. in order to grow an "undoped" and n-type light-emitting layer 4 of InGaN to a thickness of 6 nm.

After the light-emitting layer 4 is formed, the TMI carrier gas and the TMG carrier gas are discontinued, the surface temperature of substrate 1 is raised up-to 1050° C., and new gases are provided; nitrogen gas, as the main carrier gas, at 9 liter/min., hydrogen gas at 0.90 liter/min., a TMG carrier gas at 4 cc/min., a TMA carrier gas at 6 cc/min., a carrier gas of bis-cyclo-pentadienyel-magnesium($Cp_2Mg$), as Mg source, at 60 cc/min. for a duration of 4 min. in order to grow a p-type clad layer 5 of Mg doped AlGaN to a thickness of 0.1 $\mu$m.

After the p-type clad layer 5 is grown and formed, the TMA carrier gas, the TMG carrier gas and the $Cp_2Mg$ carrier gas are discontinued. The substrate temperature is maintained at 1050° C. for a duration of 8 min. to diffuse the Mg doped in the p-type clad layer 5 into the light-emitting layer 4, in order to form a p-type layer 42 at the side of light-emitting layer 4 having contact with p-type clad layer 5 in the thickness of approximately 3 nm, and an n-type layer 41 at the side of light-emitting layer 4 having contact with n-type clad layer 3 in the thickness of approximately 3 nm. The light-emitting layer 4 thus formed comprises stacked layers, namely, the n-type layer 41 and the p-type layer 42.

Maintaining the temperature at 1050° C., nitrogen gas, as the main carrier gas, is newly provided at 9 liter/min., hydrogen gas at 0.90 liter/min., a TMG carrier gas at 4 cc/min. and a $Cp_2Mg$ carrier gas at 100 cc/min. for a duration of 3 min. in order to grow a p-type contact layer 6 of Mg doped GaN to a thickness of 0.1 $\mu$m.

After the growth is completed, the supply of material gases, TMG carrier gas, $Cp_2Mg$ carrier gas, and ammonia is discontinued, while the flow of nitrogen gas and hydrogen gas is maintained at the same flow rate until the wafer is cooled down to the room temperature. The wafer is then taken out of the reaction tube.

On the surface of a substance of stacked layers of GaN group compound-semiconductor containing a pn junction structured through the above described procedure, a $SiO_2$ film is deposited by a CVD method. The film is patterned in a certain predetermined shape by a photo lithographic process to provide an etching mask. The p-type contact layer 6, the p-type clad layer 5 and the light-emitting layer 4 are partially etched-off by a reactive ion etching method in the depth of approximately 0.25 $\mu$m to expose the surface of the n-type layer 3. On the exposed surface of n-type layer 3, an n-side electrode 8 of Al is formed by deposition. A p-side electrode 7 of Ni and Au is formed on the surface of p-type contact layer 6.

The sapphire substrate 1 is polished in the reverse surface down to approximately 100 $\mu$m thick, and separated into chips by scribing. A light-emitting device as shown in FIG. 2 is provided through the above described procedure.

A GaN group compound-semiconductor light-emitting device thus manufactured is attached on a stem with the surface having the electrode up. The respective n-side electrode 8 and p-side electrode 7 on the chip are connected with wire to electrodes of the stem, and the whole structure is resin-molded to complete a light-emitting diode. When the light-emitting diode is driven with 20 mA forward current, it emits a blue light of 455 nm wavelength; has a spectral half band width of 18 nm, and a luminous output of 1050 $\mu$W.

Embodiment 3

Referring again to FIG. 3, an exemplary process for forming the device is now described.

After a buffer layer 2 and an n-type clad layer 3 have been formed on a substrate 1 in the same way as in embodiment 2, nitrogen gas, as the main carrier gas, is newly provided at 10 liter/min., a TMG carrier gas at 2 cc/min. and a TMI carrier gas at 200 cc/min. at a temperature 750° C. At the same time, $SiH_4$ gas is provided in a linear declining mode starting from at 10 cc/min. down to 0.1 cc/min. for a duration of 70 sec. to grow part of light-emitting layer 4 of InGaN to a thickness of 70 nm. And then, the $SiH_4$gas is discontinued, while the TMG carrier gas and the TMI carrier gas are kept flowing at the same flow rate for a duration of 130 sec. to grow the remaining part of the light-emitting layer 4 to a thickness of 130 nm.

And then, the TMI carrier gas and the TMG carrier gas are discontinued, the surface temperature of substrate 1 is raised up-to 1050° C., nitrogen gas, as the main carrier gas, is newly provided at 9 liter/min., hydrogen gas at 0.90 liter/min., a TMG carrier gas at 4 cc/min., a TMA carrier gas at 6 cc/min., a $Cp_2Mg$ carrier gas at 60 cc/min., for a duration of 4 min. in order to grow a p-type clad layer 5 of Mg doped AlGaN to a thickness of 0.1 $\mu$m.

After the p-type clad layer 5 is grown and formed, supply of the TMA carrier gas, the TMG carrier gas and the $Cp_2Mg$ carrier gas is discontinued, temperature of the substrate 1 is maintained at 1050° C. for a duration of 15 min. to diffuse the Mg doped in p-type clad layer 5 into the light-emitting layer 4; making the side of the light-emitting layer 4 having contact with p-type clad layer 5 into a p-type layer 42 in the thickness of approximately 7 nm, the side of the light-emitting layer 4 having contact with n-type layer a into an n-type layer 41 in the thickness of approximately 7 nm, and the layered region locating between the n-type layer 41 and the p-type layer 42 into an i-type layer 43 in the thickness of approximately 6 nm. Thus the light-emitting layer 4 is formed so as to comprise stacked layers, namely, the n-type layer 41, the i-type layer 43 and the p-type layer 42.

A light-emitting device of FIG. 3 is completed after an electrode is formed thereon, and separated into chips, in the same way as in embodiment 2. When a light-emitting diode is fabricated in the same as in embodiment 1, and driven with a 20 mA forward current, it emits a blue light of 445 nm wavelength; has a spectral half band width of 17 nm, and a luminous output 1150 μW.

Although the elements of the present invention have been described in conjunction with a certain embodiments, it is appreciated that the invention may be implemented in a variety of other ways. Consequently, it is to be understood that the particular embodiments shown and described by way of illustration are in no way intended to be considered limiting. Reference to the details of these embodiments is not intended to limit the scope of the claims which themselves recite only those features regarded as essential to the invention.

What is claimed is:

1. A gallium-nitride-group compound-semiconductor light-emitting device comprising:
    an n-type layer of gallium-nitride-group compound-semiconductor;
    a p-type layer of gallium-nitride-group compound-semiconductor; and
    a light-emitting layer of gallium-nitride-group compound-semiconductor disposed between said n-type layer and said p-type layer;
    said light-emitting layer doped with a p-type impurity such that the concentration of the p-type impurity gradually decreases as the distance from the p-type layer increases, said light-emitting layer having the highest concentration of said p-type impurity in this portion of said light-emitting layer adjacent said p-type layer, said light-emitting layer having the lowest concentration of said p-type impurity in the portion of said light-emitting layer adjacent said n-type layer.

2. The gallium-nitride-group compound-semiconductor light-emitting device of claim 1, wherein said p-type impurity has a concentration not lower than $1 \times 10^{16}$ cm$^{-3}$ and not higher than $5 \times 10^{18}$ cm$^{-3}$ in said portion of said light-emitting layer adjacent said n-type layer.

3. The gallium-nitride-group compound-semiconductor light-emitting device of claim 1, wherein said p-type impurity has a concentration not lower than $1 \times 10^{18}$ cm$^{-3}$ and not higher than $5 \times 10^{20}$ cm$^{-3}$ in said portion of said light-emitting layer adjacent said p-type layer.

4. The gallium-nitride-group compound-semiconductor light-emitting device according to claims 1, 2 or 3, wherein said light-emitting layer is formed of In x Ga $_{1-xN}$ (0<x<1).

5. The gallium-nitride-group compound-semiconductor light-emitting device according to claims 1, 2, 3 or 4, wherein said p-type impurity is Mg.

6. The gallium-nitride-group compound-semiconductor light-emitting device according to claim 1, wherein light emitting device is a laser diode.

7. A gallium-nitride-group compound-semiconductor light-emitting device comprising:
    an n-type clad layer of gallium-nitride-group compound-semiconductor;
    a p-type clad layer of gallium-nitride-group compound-semiconductor; and
    a light-emitting layer of gallium-nitride-group compound-semiconductor disposed between said n-type clad layer and said p-type clad layer, said light-emitting layer comprising an n-type layer and a p-type layer, said n-type layer disposed so as to contact said n-type cladding layer, said p-type layer disposed so as to contact said p-type clad layer.

8. The gallium-nitride-group compound-semiconductor light-emitting device according to claim 6, wherein said n-type layer and said p-type layer have a band-gap energy greater than the band-gap energy of said light-emitting layer.

9. A gallium-nitride-group compound-semiconductor light-emitting device comprising:
    an n-type clad layer of gallium-nitride-group compound-semiconductor;
    a p-type clad layer of gallium-nitride-group compound-semiconductor; and
    a light-emitting layer of gallium-nitride-group compound-semiconductor disposed between said n-type clad layer and said p-type clad layer, said light-emitting layer comprising an n-type layer, an i-type layer and a p-type layer, said n-type layer disposed so as to contact said n-type cladding layer, said p-type layer disposed so as to contact said p-type clad layer, said i-type layer disposed between said n-type layer and said p-type layer.

10. A The gallium-nitride-group compound-semiconductor light-emitting device according to claim 8, wherein said i-type layer has a low carrier concentration.

* * * * *